United States Patent

Van Delden et al.

[11] Patent Number: 6,100,686
[45] Date of Patent: Aug. 8, 2000

[54] MAGNETIC FIELD SENSOR WITH DOUBLE WHEATSTONE BRIDGE HAVING MAGNETO-RESISTIVE ELEMENTS

[75] Inventors: Martinus H. W. M. Van Delden; Kars-Michiel H. Lenssen; Marcellinus J. M. Pelgrom; Gerjan F. A. Van De Walle, all of Eindhoven, Netherlands

[73] Assignee: U.S. Philips Corporation, New York, N.Y.

[21] Appl. No.: 09/096,074

[22] Filed: Jun. 11, 1998

[51] Int. Cl.[7] .............................. G01R 33/09; H01L 43/02
[52] U.S. Cl. .................... 324/252; 338/32 R; 324/207.12
[58] Field of Search ............................... 324/252, 207.21, 324/207.12, 260; 338/32 H, 32 R

[56] References Cited

U.S. PATENT DOCUMENTS 4,673,827  6/1987  Sommer ............................. 324/207.12

OTHER PUBLICATIONS

"Semiconductor Sensors", Philips Semiconductors Data Handbook SC17, pp. 33–38, Nov. 1994.

Primary Examiner—Jay Patidar
Attorney, Agent, or Firm—Leroy Eason

[57] ABSTRACT

A magnetic field sensor has a substrate on which a plurality of resistive elements form a double Wheatstone bridge circuit, at least one of the resistive elements in each bridge having a magneto-resistive characteristic. The two bridges are identical except in that, if a given magneto-resistive element in a given branch in one bridge has a positive output polarity, then the corresponding magneto-resistive element in the same branch in the other bridge will have a negative output polarity. By adding the output signals of the two Wheatstone bridges a zero-point offset of the sensor can be determined and eliminated. There is no need to employ the so-called flipping technique employed for that purpose in conventional sensors, which requires increased power consumption.

4 Claims, 2 Drawing Sheets

MAGNETIC FIELD SENSOR WITH DOUBLE WHEATSTONE BRIDGE HAVING MAGNETO-RESISTIVE ELEMENTS

BACKGROUND OF THE INVENTION

1. Field of the Invention

The invention relates to a sensor comprising a substrate on which a plurality of resistive elements is arranged in a Wheatstone bridge configuration, whereby at least one of the resistive elements demonstrates a magneto-resistive effect, the resistive elements being provided in branches which respectively connect:

(a) a current input terminal with a first voltage terminal;
(b) the first voltage terminal with a current output terminal;
(c) the current output terminal with a second voltage terminal;
(d) the second voltage terminal with the current input terminal.

Sensors of this type may be employed inter alia:

in compasses, for detecting the terrestrial magnetic field, e.g. in automotive, aviation, maritime or personal navigation systems;

in position sensors and/or angle sensors (e.g. in automotive applications);

as field sensors in medical scanners, and as replacements for Hall probes in various other applications;

as current sensors, whereby the magnetic field produced by an electrical current is detected;

as memory cells in Magnetic Random-Access Memories (MRAMs);

as magnetic heads, which can be used to decrypt the magnetic flux emanating from a recording medium in the form of a magnetic tape, disc or card.

2. Description of the Related Art

Magneto-resistance is a phenomenon whereby the electrical resistance of a body can be influenced by magnetic flux. In particular, the electrical resistance of the body changes in a predictable manner in response to a varying magnetic flux, making such a body suitable for use as a magnetic-electric transducer in a magnetic field sensor. However, as with any resistive body, the electrical resistance of such a body can also be influenced by other environmental factors, particularly temperature. A problem in (sensitive) practical applications is thus to devise some means of differentiating between transducer signals resulting from (varying) magnetic flux and (unwanted) transducer signals emanating from other environmental sources. A popular approach is to include at least one magneto-resistive element in a Wheatstone bridge arrangement.

A sensor as specified in the opening paragraph is known, for example, from PHILIPS SEMICONDUCTORS data handbook SC17 (1995), Semiconductor Sensors, pp 33–38. The sensor therein described employs the so-called flipping technique to allow it to measure very weak magnetic fields. According to this technique, the magnetization direction in each of the Wheatstone bridge's magneto-resistive elements is periodically reversed using an external flipping field. Such periodic reversal causes a corresponding reversal of the polarity of the bridge's output signal as a function of applied magnetic field. Addition of the normal and inverted outputs allows the bridge's zero-point offset to be determined and (electronically) eliminated, such offset being principally caused by mask alignment errors during fabrication of the bridge.

The known sensor suffers from a number of disadvantages. In particular, a relatively large electrical current (of the order of about 1 ampere) is generally needed to generate the required flipping field, causing greatly increased power consumption and consequently hindering the use of batteries as a power source. In addition, the flipping technique can have a destabilizing effect on the magnetization of the magneto-resistive element(s), particularly when such elements are based on the Anisotropic Magneto-Resistance (AMR) effect; such destabilization leads to increased noise levels.

SUMMARY OF THE INVENTION

It is an object of the invention to alleviate these problems. In particular, it is an object of the invention to provide a sensor which lends itself to the measurement of weak magnetic fields without having to rely on the flipping technique described hereabove.

These and other objects are achieved in a sensor as specified in the opening paragraph, characterized in that the sensor comprises a second Wheatstone bridge which is electrically connected to the first Wheatstone bridge already referred to, the first and second Wheatstone bridges being identical except in that, if a given magneto-resistive element in a given branch in one bridge has a positive output polarity, then the corresponding magneto-resistive element in the same branch in the other bridge has a negative output polarity.

The relationship between the first and second voltage terminals $V_Q, V_R$ in the first bridge and the first and second voltage terminals $V_Q', V_R'$ in the second bridge is defined in terms of the output signals tapped from both bridges, in that if $V_Q-V_R$ is regarded as the output signal $V_{QR}$ from the first bridge, then $V_Q'-V_R'$ is regarded as the output signal $V_{QR}'$ from the second bridge. Once this relationship is defined, the meaning of the term "corresponding" in the previous paragraph is unambiguous.

The "output polarity" of a magneto-resistive element may be positive or negative depending on whether the electrical resistance of such an element decreases or increases in response to a reference magnetic stimulus, e.g. an increasing magnetic field in a given direction. In general, the electrical resistance of such an element will contain a fixed offset (without any output polarity) and a field-variable portion (with a given output polarity, determined by the polarizing means).

The invention exploits the insight that, as a result of the polarity reversal in the second Wheatstone bridge, that bridge is effectively a permanently "flipped" version of the first Wheatstone bridge, without requiring the use of a flipping field. Consequently, the sensor according to the invention has a number of important advantages, including:

reduced noise levels, since all magneto-resistive elements in both bridges have a permanently stable magnetization configuration;

lower power consumption, since the lack of a flipping field no longer requires an additional (substantial) electrical current;

simpler electronics, since there is no need to periodically produce a flipping field;

the possibility to measure AC magnetic flux without encountering mismatch problems with flipping-field frequency.

In the sensor according to the invention, the zero-point offset can be determined by adding the outputs of the first and second Wheatstone bridges. After subtraction of this zero-point offset, the output signal of the double Wheatstone bridge configuration is twice a large as that from a single (known) Wheatstone bridge. If so desired, this fact allows the area of the first and second Wheatstone bridges to be halved, resulting in a sensor having the same net size and the same output level as a single Wheatstone bridge.

In general, the more magneto-resistive elements which are present in the Wheatstone bridge, the more sensitive will it be to external magnetic flux. An advantageous embodiment of the sensor according to the invention is therefore characterized in that all of the resistive elements in the first Wheatstone bridge demonstrate a magneto-resistive effect (in which case all the resistive elements in the second Wheatstone bridge will also demonstrate a magneto-resistive effect). Such a sensor should be embodied in such a manner that, when the branches in the first Wheatstone bridge are traversed in the consecutive order (a), (b), (c), (d), the output polarity of the resistive elements in each consecutive branch is alternatively positive and negative.

A particular embodiment of the sensor according to the invention is characterized in that at least one of the resistive elements demonstrates the Anisotropic Magneto-Resistance (AMR) effect. The output polarity of such an AMR element can be determined as follows:

the element is assumed to have a fixed magnetization direction $M_o$ in the absence of an external magnetic field;

the element is provided with a so-called barber-pole structure, having at least one conductive strip which extends parallel to a major surface of the substrate and lies across the element so as to subtend an acute directional angle $\pm\theta$ with $M_o$;

by choosing a directional angle of $+\theta$ or $-\theta$, the polarity of the output signal of the associated AMR element can be caused to have a positive or negative polarity, as required by the invention. The sign of $\theta$ can, for example, be defined as positive (+) in the case of a clockwise cant away from $M_o$ and negative (−) in the case of a counterclockwise cant away from $M_o$, as observed in plan view (i.e. normal to the substrate); since $\theta$ is acute, such a definition is unambiguous. AMR is observed in magnetic alloys such as NiFe (permalloy), FeNiCo and CoFe, for example. Barber-pole structures are widely known and applied in the art, and serve both to linearize the output signal from, and to magnetically bias, the associated AMR element.

In general, the barber-pole referred to above will consist of several mutually parallel diagonal strips. However, current miniaturization trends have seen the emergence of AMR thin-film sensors which only have diagonal electrical contacts, without intervening diagonal strips; such diagonal contacts also subtend a directional angle $\pm\theta$ with $M_o$, and should be interpreted as falling within the scope of the term "barber-pole" as here employed.

In the case of the embodiment referred to in the previous two paragraphs, the value of $\theta$ is preferably 45±5°. Such a sensor is then at its most sensitive.

An alternative embodiment of the sensor according to the invention is characterized in that at least one of the resistive elements demonstrates the Giant Magneto-Resistance (GMR) effect. The output polarity of such a GMR element can be determined as follows:

the GMR element is assumed to have at least two magnetic portions having respective magnetizations $M_1$ and $M_2$;

the element is magnetically biased in such a way that $M_1$ and $M_2$ subtend a vectorial angle $\alpha$ with one another;

if, in response to a reference magnetic field, $\alpha$ increases/decreases, then the element is defined to have a positive/negative output polarity (these two situations corresponding to increasing/decreasing electrical resistance of the element concerned).

GMR is observed in material structures such as antiferromagnetically coupled magnetic multilayers (e.g. Co/Cu and Fe/Cr), exchange-biased spin-valve multilayers (e.g. FeMn/NiFe/Cu/NiFe), and so-called hard/soft multilayers (i.e. GMR multilayers having ferromagnetic layers of mutually different magnetic coercivities). The magnetic biasing referred to may, for example, be achieved using permanent magnets which are appropriately positioned in proximity to the various GMR elements. However, generally more satisfactory magnetic biasing means employ a current-carrying conductor running in proximity to the GMR elements; see, for example, the discussion in European Patent Application EP 97201143.1 (PHN 16.324).

In the case of the embodiment referred to in the previous paragraph, the value of $\alpha$ is preferably 90±5°. Such a sensor has a magneto-resistance characteristic which is virtually free of hysteresis (since magnetization rotation dominates over domain-wall displacement).

It should be explicitly noted that, in the sensor according to the invention, the first and second Wheatstone bridges may be connected in series or in parallel.

According to the invention, the first and second Wheatstone bridges can be provided on the substrate in different manners. For example, the two bridges may be provided side by side (as in FIG. 1), or nested one within the other (as in FIG. 2), or stacked one on top of the other. The individual resistive elements in each bridge may also be coplanar or stacked.

BRIEF DESCRIPTION OF THE DRAWINGS

The invention and its attendant advantages will be further elucidated with the respect to particular embodiments and the accompanying schematic drawings, wherein.

Corresponding features in the various Figures are denoted by the same reference symbols.

DESCRIPTION OF THE PREFERRED EMBODIMENTS

Figure 1:
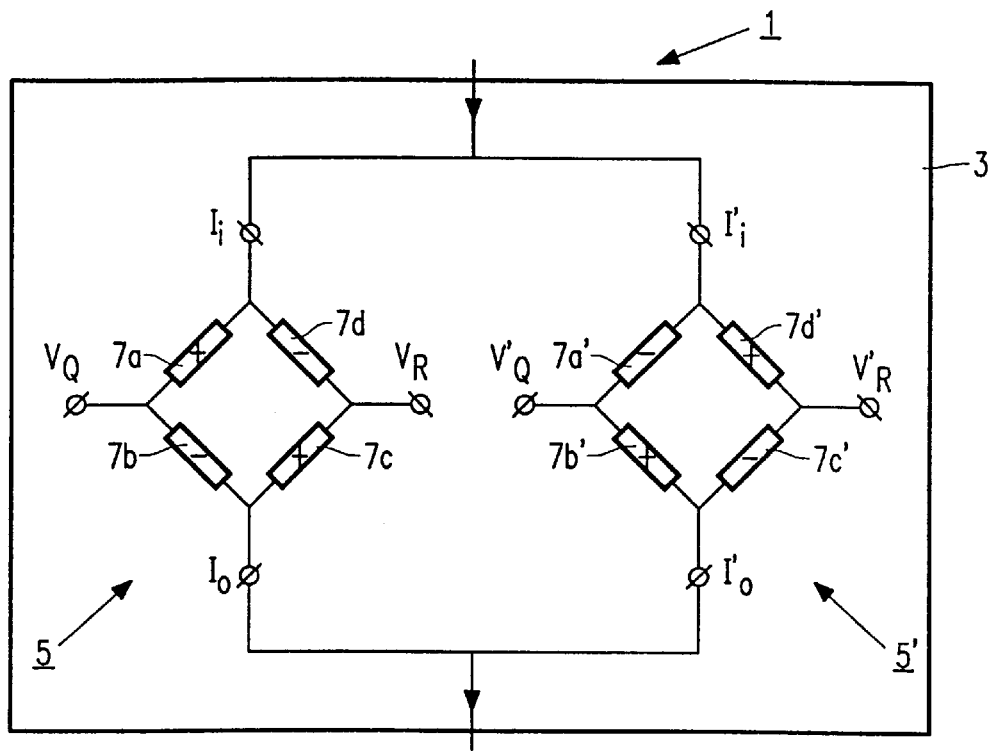
FIG. 1 is a plan view of a general embodiment of a sensor according to the invention.

FIG. 1 is a plan view of part of a first embodiment of a sensor according to the invention. The sensor comprises a substrate 1 having a major surface 3 on which a first Wheatstone bridge 5 is provided. The bridge 5 has a respective current input terminal $I_i$, current output terminal $I_o$, first voltage terminal $V_Q$ and second voltage terminal $V_R$. Branches (a),(b),(c),(d) are located between the respective terminal pairs $(I_i,V_Q),(V_Q,I_o),(I_o,V_R),(V_R,I_i)$, and these branches respectively contain resistive elements 7a,7b,7c,7d.

In this particular case, all of the elements 7a,7b,7c,7d demonstrate a magneto-resistive effect. Each of these elements has a certain output polarity (positive or negative). In this particular case, elements 7a and 7c have a positive output polarity (schematically depicted by a "+" symbol), whereas elements 7b and 7d have a negative output polarity (schematically depicted by a "−" symbol).

In accordance with the invention, the sensor comprises a second Wheatstone bridge 5' which is electrically connected to the first Wheatstone bridge 5 (in this case, the current terminals of the bridges 5,5' are connected in parallel). In as much as certain features in the second bridge 5' correspond to those in the first bridge 5, such features are denoted by the same basic symbol accompanied by an accent (').

The second bridge 5' is identical to the first bridge 5 in all aspects, except that each magneto-resistive element 7a',7b', 7c',7d' in the second bridge 5' has the opposite output polarity to the corresponding magneto-resistive element 7a,7b,7c,7d in the first bridge 5. As a result, the output signal $V_{QR}'$ across the terminals $V_Q',V_R'$ in bridge 5' will have the opposite polarity to the output signal VQR across the terminals $V_Q,V_R$ in bridge 5; in this manner, the bridge 5' may be regarded as a permanently "flipped" rendition of the bridge 5.

Figure 2:
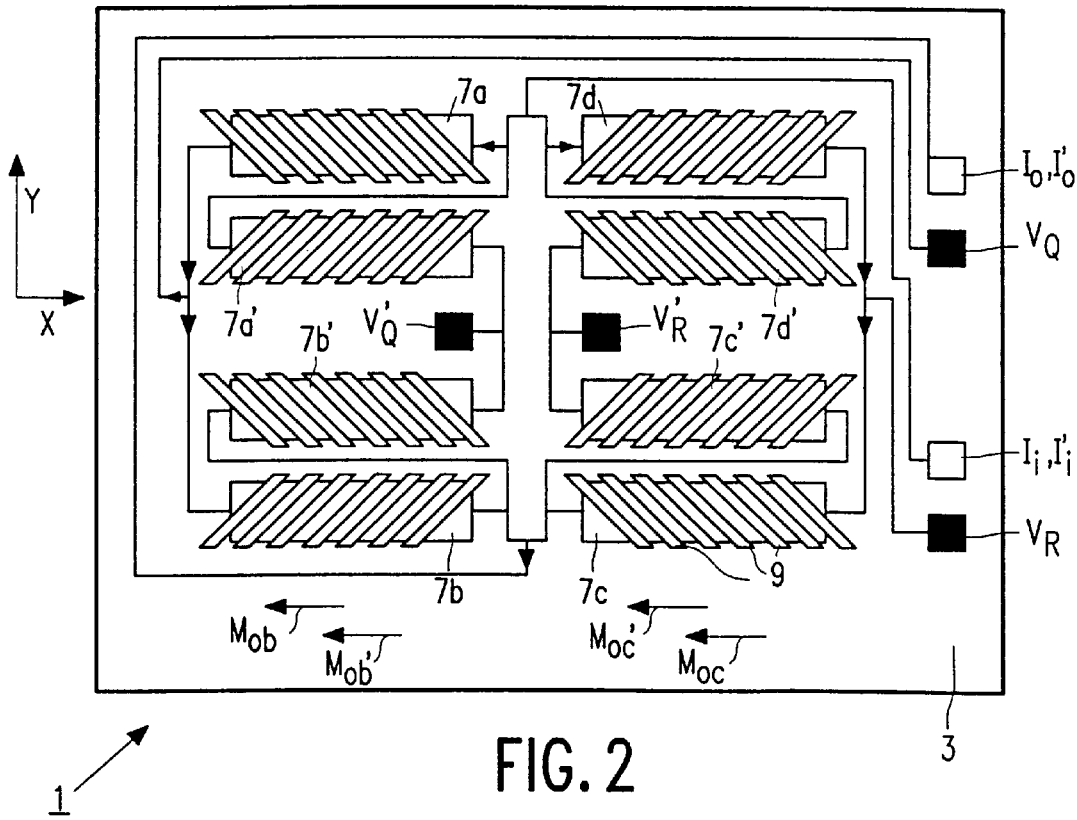
FIG. 2 is a plan view of another embodiment of the sensor according to the invention, employing AMR elements.

FIG. 2 is a plan view of a second embodiment of the sensor according to the invention, employing AMR elements. A major surface 3 of a substrate 1 is provided with a pair of parallel-connected Wheatstone bridges. However, unlike the side-by-side situation in FIG. 1, the Wheatstone bridges in FIG. 2 are nested, so as to occupy as little space as possible on the surface 3.

The magneto-resistive elements 7a,7b,7c,7d,7a',7b',7c', 7d' are all AMR elements. Each such element is provided with a barber-pole structure, consisting in this case of a series of metallic strips 9 lying in a plane parallel to the surface 3 and diagonally crossing the underlying AMR element. All the diagonal strips subtend an angle of ±45° with the depicted x-axis.

By way of example, the vectors $M_{ob},M_{oc},M_{ob}',M_{oc}'$ represent the zero-field magnetizations in the AMR elements 7b,7c,7b',7c', respectively. In the case of element 7b, the overlying strips 9 are canted counterclockwise away from $M_{ob}$, whereas, in the case of element 7c, the strips 9 are canted clockwise away from $M_{oc}'$. In contrast (in accordance with the invention), in the case of element 7b', the strips 9 are canted clockwise away from $M_{ob}'$, whereas, in the case of element 7c', the strips 9 are canted counterclockwise away from $M_{oc}'$.

Figure 3:
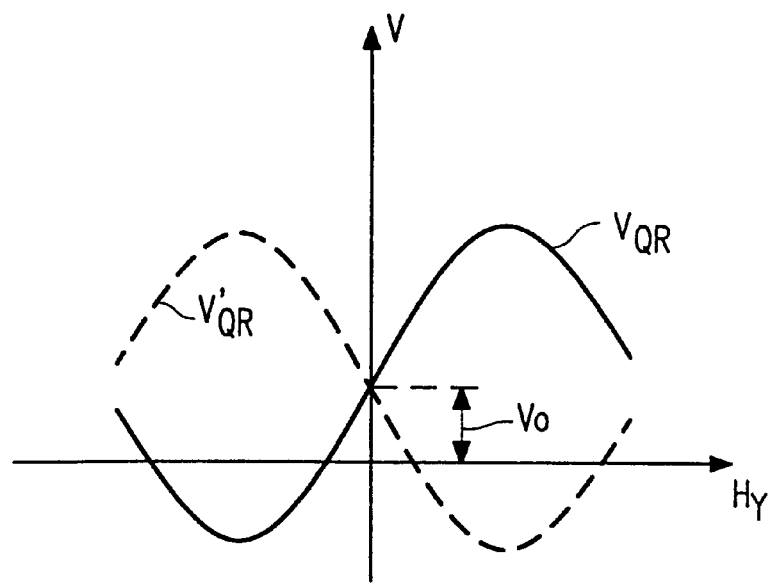
FIG. 3 graphically depicts the output signals of the first and second Wheatstone bridges in FIG. 2.

FIG. 3 is a graphical depiction of the outputs $V_{QR}$ and $V_{QR}'$ from the two Wheatstone bridges in FIG. 2, as a function of an applied magnetic field $H_y$ of variable magnitude, directed parallel to the depicted y-axis. Both outputs $V_{QR},V_{QR}'$ comprise a DC offset $V_o$ on which a field-variable portion is superimposed. It is clear that, as far as this field-variable portion is concerned, $V_{QR}$ is the inverse of $V_{QR}'$, so that adding $V_{QR}$ and $V_{QR}'$ will cause cancellation of the two field-variable portions and yield a resultant of $2V_o$, thereby allowing the value of $V_o$ to be determined. Subtraction of this value of $V_o$ from either $V_{QR}$ or $V_{QR}'$ will then yield an offset-corrected sensor output signal.

Figure 4:
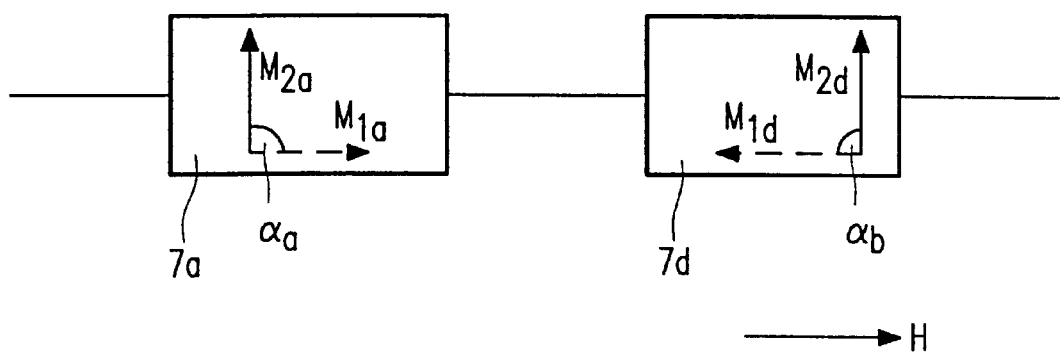
FIG. 4 is a plan view of two GMR magneto-resistive elements having opposite output polarities.

FIG. 4 is a plan view of two magneto-resistive elements 7a,7d from a Wheatstone bridge 5 as depicted in FIG. 1. Both elements 7a,7d are GMR elements.

As here depicted, each element 7a,7d comprises two magnetic layers in stacked arrangement (an upper layer and a lower layer), with an interposed non-magnetic layer. The upper and lower layers have respective magnetizations $M_{1a}$, $M_{2a}$ in the case of element 7a and $M_{1d}$, $M_{2d}$ in the case of element 7d. The magnetizations $M_{1a},M_{1d}$ are fixed using, for example, an exchange-biasing technique; on the other hand, the vectors $M_{2a},M_{2d}$ are free to rotate. In this manner, the elements act as spin-valve trilayers.

In the absence of an external magnetic field, the vectorial angle $\alpha_a$ between $M_{1a}$ and $M_{2a}$ and the vectorial angle $\alpha_d$ between $M_{1d}$ and $M_{2d}$ are both 90° (achieved, for example, using a magnetic annealing technique). However, in the presence of the magnetic field H, $\alpha_a$ decreases and $\alpha_d$ increases. Consequently, the output polarities of elements 7a,7d are mutually opposite.

What is claimed is:

1. A sensor comprising a substrate on which a plurality of resistive elements are arranged in a first Wheatstone bridge configuration, wherein at least one of the resistive elements demonstrates a magneto-resistive effect, the resistive elements being provided in branches which respectively connect:

(a) a current input terminal with a first voltage terminal;
    (b) the first voltage terminal with a current output terminal;
    (c) the current output terminal with a second voltage terminal;
    (d) the second voltage terminal with the current input terminal, characterized in that the sensor further comprises a second Wheatstone bridge which is electrically connected to the first Wheatstone bridge, the first and second Wheatstone bridges being identical except in that, if a given magneto-resistive element in a given branch in one bridge has a positive output polarity, then the corresponding magneto-resistive element in the same branch in the other bridge has a negative output polarity.

2. A sensor according to claim 1, characterized in that all of the resistive elements in the first Wheatstone bridge demonstrate a magneto-resistive effect.

3. A sensor according to claim 1, characterized in that at least one of the resistive elements demonstrates the Anisotropic Magneto-Resistance effect.

4. A sensor according to claim 1, characterized in that at least one of the resistive elements demonstrates the Giant Magneto-Resistance effect.

\* \* \* \* \*